United States Patent
Mori et al.

(10) Patent No.: US 9,199,434 B2
(45) Date of Patent: Dec. 1, 2015

(54) RESIN COMPOSITION, PREPREG AND THEIR USES

(71) Applicant: MITSUBISHI GAS CHEMICAL COMPANY, INC., Tokyo (JP)

(72) Inventors: Kenichi Mori, Tokyo (JP); Syouichi Itoh, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 73 days.

(21) Appl. No.: 14/263,066

(22) Filed: Apr. 28, 2014

(65) Prior Publication Data

US 2014/0235126 A1  Aug. 21, 2014

Related U.S. Application Data

(62) Division of application No. 12/379,042, filed on Feb. 11, 2009, now Pat. No. 8,748,541.

(30) Foreign Application Priority Data

Feb. 12, 2008  (JP) ................................ 2008/030116
Nov. 13, 2008  (JP) ................................ 2008/290803

(51) Int. Cl.
| | |
|---|---|
| B32B 15/092 | (2006.01) |
| C08L 71/12 | (2006.01) |
| C08G 65/44 | (2006.01) |
| C08G 65/48 | (2006.01) |
| C08J 5/24 | (2006.01) |
| H05K 1/03 | (2006.01) |
| H05K 1/05 | (2006.01) |
| B32B 17/04 | (2006.01) |
| B32B 27/04 | (2006.01) |
| C08K 3/36 | (2006.01) |
| C08K 5/3415 | (2006.01) |
| C08L 63/00 | (2006.01) |

(52) U.S. Cl.
CPC .............. *B32B 15/092* (2013.01); *C08G 65/44* (2013.01); *C08G 65/485* (2013.01); *C08J 5/24* (2013.01); *C08L 71/126* (2013.01); *H05K 1/036* (2013.01); *H05K 1/0353* (2013.01); *H05K 1/0366* (2013.01); *H05K 1/056* (2013.01); *C08J 2363/00* (2013.01); *C08K 5/3415* (2013.01); *C08L 63/00* (2013.01); *Y10T 428/31511* (2015.04); *Y10T 428/31522* (2015.04); *Y10T 428/31529* (2015.04); *Y10T 442/2934* (2015.04); *Y10T 442/30* (2015.04); *Y10T 442/3415* (2015.04); *Y10T 442/3423* (2015.04)

(58) Field of Classification Search
None
See application file for complete search history.

(56) References Cited

U.S. PATENT DOCUMENTS

| | | |
|---|---|---|
| 6,596,893 B2 | 7/2003 | Nakacho et al. |
| 2005/0182203 A1 | 8/2005 | Sugano et al. |
| 2006/0038324 A1 | 2/2006 | Yeager et al. |
| 2007/0213477 A1 | 9/2007 | Ukawa et al. |
| 2008/0187763 A1 | 8/2008 | Kato et al. |

FOREIGN PATENT DOCUMENTS

| | | |
|---|---|---|
| JP | 2005-89636 | 4/2005 |
| JP | 2006-131743 | 5/2006 |
| JP | 2009-24056 | 2/2009 |

OTHER PUBLICATIONS

European Search Report dated Jun. 5, 2009 in European Patent Application No. 09 25 0338.

*Primary Examiner* — Robert Sellers
(74) *Attorney, Agent, or Firm* — Wenderoth, Lind & Ponack, L.L.P.

(57) ABSTRACT

A vinyl-compound-based resin composition containing a terminal vinyl compound (a) of a bifunctional phenylene ether oligomer having a polyphenylene ether skeleton, a specific maleimide compound (b), a naphthol aralkyl type cyanate ester resin (c) and a naphthalene-skeleton-modified novolak type epoxy resin (d) for a high-multilayer and high-frequency printed wiring board, which resin composition is excellent in varnish shelf life at low temperature and does not show a decrease in multilayer moldability, heat resistance after moisture absorption, electrical characteristics and peel strength even in a winter period and for a long period of time, and a prepreg, a metal-foil-clad laminate and a resin sheet each of which uses the above resin composition.

5 Claims, No Drawings

RESIN COMPOSITION, PREPREG AND THEIR USES

This application is a divisional of application Ser. No. 12/379,042 filed Feb. 11, 2009, U.S. Pat. No. 8,748,541.

FIELD OF THE INVENTION

The present invention relates to a resin composition excellent in peel strength, heat resistance after moisture absorption and electrical characteristics and a prepreg, a metal-foil-clad laminate and a resin sheet, each of which uses the above resin composition. The resin composition is suitably used for a mother board and a semiconductor plastic package having a semiconductor chip mounted thereon, as a resin composition for use in a printed wiring board for lead-free soldering reflow, high frequency and high multilayer.

BACKGROUND OF THE INVENTION

In recent years, information terminal devices such as personal computers and servers and telecommunications devices such as internet routers and optical communication are required to process mass data at high speed and the speed and frequency of electric signals are increasingly becoming higher. Accordingly, laminates for printed wiring boards to be used for these devices are required to have a lower dielectric constant and a lower dielectric loss tangent, in particular to have a lower dielectric loss tangent, for the purpose of coping with the demand for high frequency.

For coping with these demands, conventionally, a cyanate ester resin (see, for example JP-A-2005-120173) and a polyphenylene ether resin (see, for example JP-A-2005-112981) are known as a resin for laminates for high frequency uses. As an epoxy resin to be used for high frequency uses, many reports say a biphenyl aralkyl type novolak epoxy resin is excellent in dielectric characteristics (see, for example, JP-A-10-237162, JP-A-2002-179761 and JP-A-2007-224162).

However, the above-mentioned biphenyl aralkyl novolak type epoxy resin has a problem in that a solution article thereof, which is obtained by dissolving the biphenyl aralkyl type novolak epoxy resin in an organic solvent, is poor in shelf life. As for the shelf life of a solution article of a resin composition, it is generally necessary that a solid content does not precipitate for at least three months when it is stored at 5° C. On the other hand, the solution product of the biphenyl aralkyl type novolak epoxy resin shows a precipitation of a solid content in a short period of time or about two weeks when stored at 5° C. Therefore, the stability of the quality of a prepreg or laminate which uses a varnish obtained by dissolving a resin composition containing the biphenyl aralkyl type novolak epoxy resin is a large problem.

SUMMARY OF THE INVENTION

It is an object of the present invention to provide a vinyl-compound-based resin composition for a printed wiring board for high multilayer structure and high frequency, which resin composition is excellent in varnish shelf life at low temperature and does not show a decrease in multilayer moldability, heat resistance after moisture absorption, electrical characteristics and peel strength in a winter period and during a long period of time, and a prepreg, a metal-foil-clad laminate and a resin sheet each of which uses the above resin composition. In the present invention, the shelf life is judged on the basis of the occurrence or non-occurrence of a precipitation of a solid content in a solution of a resin composition, i.e., varnish, after the solution is stored at a predetermined temperature for a predetermined period of time.

The present inventors have made diligent studies for achieving the above object and as a result found the following. By mixing a vinyl compound having a structure which is obtained by vinyl benzylation of a terminal of a bifunctional phenylene ether oligomer having a specific number average molecular weight and having a polyphenylene ether skeleton, with a maleimide compound, a naphthol aralkyl type cyanate ester resin and a naphthalene-skeleton-modified novolak type epoxy resin in a specific mixing equivalent ratio, further adding a phosphazene compound having no functional group or a bromine compound having no functional group to the mixture and further incorporating an inorganic filler jointly, the thus-obtained resin composition is excellent in varnish shelf life and improved in electrical characteristics, peel strength and thermal decomposition temperature without any decrease in multilayer moldability and heat resistance after moisture absorption. On the basis of the above finding, the present inventors have arrived at the present invention.

That is, the present invention provides a resin composition containing a vinyl compound (a) having a structure obtained by vinyl benzylation of a terminal of a bifunctional phenylene ether oligomer having a polyphenylene ether skeleton, a specific maleimide compound (b), a naphthol aralkyl type cyanate ester resin (c) and a naphthalene-skeleton-modified novolak type epoxy resin (d).

Preferably, the resin composition provided by the present invention further contains a specific cyclophosphazene compound or a brominated polycarbonate as a flame retardant and an inorganic filler.

In the resin composition provided by the present invention, more preferably, the maleimide compound (b) is a bismaleimide resin, the cyclophosphazene compound is a cyclophosphazene resin containing a cyano group and the inorganic filler is a spherical silica having an average particle diameter of 3 μm or less.

The present invention further provides a prepreg obtained by impregnating the above resin composition into a glass woven fabric and semi-curing the resultant fabric and a metal-foil-clad laminate obtained by disposing metal foil(s) on one surface or both surfaces of one prepreg as obtained above or a stack of at least two prepregs as obtained above and laminate-molding the resultant set.

The present invention furthermore provides a varnish comprising the above resin composition and an organic solvent. The present invention still further provides a resin sheet obtained by applying the above varnish to a metal foil or a film.

EFFECT OF THE INVENTION

A solution comprising the resin composition provided by the present invention and an organic solvent, i.e., varnish, is free from a precipitation of a solid content even in a long-term storage at a low temperature. Therefore, it is excellent in shelf life as a varnish. A printed wiring board which uses a prepreg or metal-foil-clad laminate obtained from the above resin composition is stable in properties such as multilayer moldability, heat resistance after moisture absorption, peel strength, electrical characteristics, dimensional stability and moldability through a winter manufacturing period. Therefore, the resin composition provided by the present invention is suitable for a printed wiring board material for a highly multilayered and high frequency printed wiring board. Its industrial practicality is remarkable high.

DETAILED DESCRIPTION OF THE INVENTION

The vinyl compound (a) represented by the formula (1), used in the present invention, is not specially limited so long as it is a vinyl compound of the formula (1) wherein —(O—X—O)— represents a structure defined by the formula (2) or the formula (3) in which $R_1$, $R_2$, $R_3$, $R_7$ and $R_8$ are the same or different and represent a halogen atom, an alkyl group having 6 or less carbon atoms or a phenyl group, $R_4$, $R_5$, $R_6$, $R_9$, $R_{10}$, $R_{11}$, $R_{12}$, $R_{13}$, $R_{14}$, $R_{15}$ and $R_{16}$ are the same or different and represent a hydrogen atom, a halogen atom, an alkyl group having 6 or less carbon atoms or a phenyl group, and -A- represents a linear, branched or cyclic bivalent hydrocarbon group having 20 or less carbon atoms, —(Y—O)— represents an arrangement of a structure defined by the formula (4) or a random arrangement of at least two kinds of structures defined by the formula (4), in which $R_{17}$ and $R_{18}$ are the same or different and represent a halogen atom, an alkyl group having 6 or less carbon atoms or a phenyl group and $R_{19}$ and $R_{20}$ are the same or different and represent a hydrogen atom, a halogen atom, an alkyl group having 6 or less carbon atoms or a phenyl group, and each of a and b is an integer of 0 to 100, provided that at least one of a and b is not 0. Further, the resin composition of the present invention can contain at least two kinds of vinyl compounds (a) which are different in structure from each other.

Examples of -A- in the formula (3) include bivalent organic groups such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthyl methylene and 1-phenylethylidene. -A- in the formula (3) is not limited to these examples.

Among the vinyl compounds (a) in the present invention, a vinyl compound (a) of the formula (1) in which $R_1$, $R_2$, $R_3$, $R_7$, $R_8$, $R_{17}$ and $R_{18}$ represent an alkyl group having 3 or less carbon atoms and $R_4$, $R_5$, $R_6$, $R_9$, $R_{10}$, $R_{11}$, $R_{12}$, $R_{13}$, $R_{14}$, $R_{15}$, $R_{16}$, $R_{19}$ and $R_{20}$ represent a hydrogen atom or an alkyl group having 3 or less carbon atoms is preferred. In particular, a vinyl compound (a) of the formula (1), in which —(O—X—O)— represented by the formula (2) or the formula (3) is a structure of the formula (8), the formula (9) or the formula (10), and —(Y—O)— represented by the formula (4) is an arrangement of a structure of the formula (11) or the formula (12) or a random arrangement of a structure of the formula (11) and a structure of the formula (12), is more preferred.

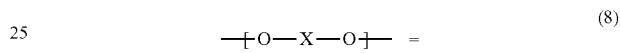

(8)

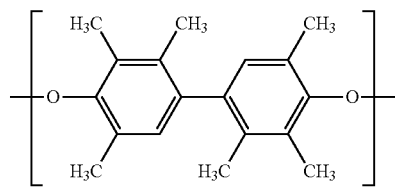

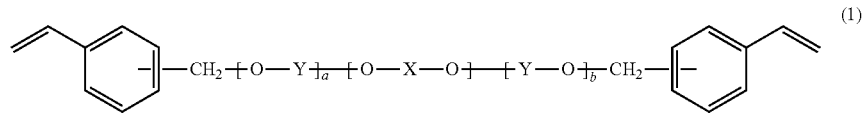

(1)

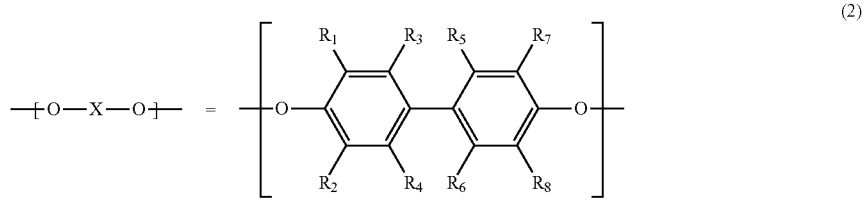

(2)

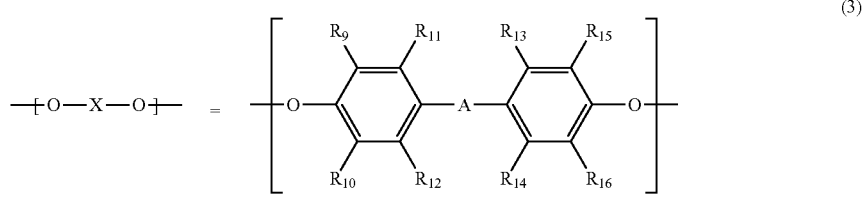

(3)

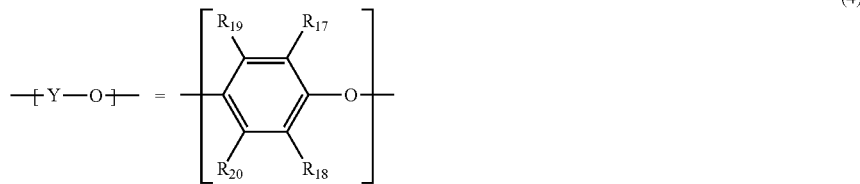

(4)

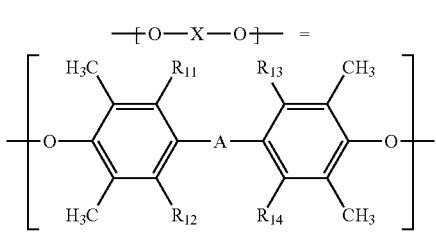

(9)

wherein $R_{11}$, $R_{12}$, $R_{13}$ and $R_{14}$ are the same or different and represent a hydrogen atom or a methyl group, and -A- is a linear, branched or cyclic bivalent hydrocarbon group having 20 or less carbon atoms.

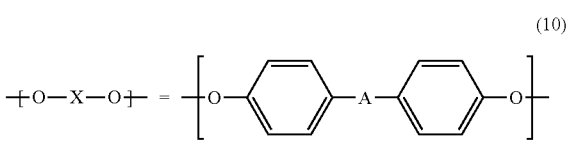

(10)

wherein -A- is a linear, branched or cyclic bivalent hydrocarbon group having 20 or less carbon atoms.

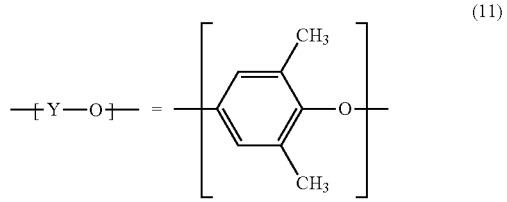

(11)

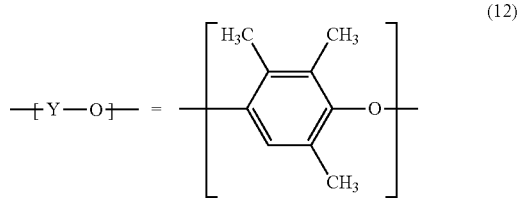

(12)

The number average molecular weight, calculated as polystyrene according to a GPC method, of the vinyl compound (a) is preferably in the range of from 500 to 3,000. When the number average molecular weight is smaller than 500, a coating film obtained from the resin composition is apt to be sticky. When it exceeds 3,000, the solubility into a solvent decreases. A process for producing the vinyl compound (a) is not specially limited. For example, it can be produced by vinylbenzyl etherification of a terminal phenolic hydroxyl group of a bifunctional phenylene ether oligomer obtained by oxidative coupling of a bifunctional phenol compound and a monofunctional phenol compound.

The bifunctional phenylene ether oligomer can be produced, for example, by dissolving the bifunctional phenol compound, the monovalent phenol compound and a catalyst in a solvent and then introducing oxygen into the resultant solution under heat with stirring. Examples of the bifunctional phenol compound include 2,2',3,3',5,5'-hexamethyl-(1, 1'-biphenol)-4,4'-diol, 4,4'-methylenebis(2,6-dimethylphenol), 4,4'-dihydroxyphenylmethane and 4,4'-dihydroxy-2,2'-diphenylpropane. The bifunctional phenol compound is not limited to these examples. Examples of the monofunctional phenol compound include 2,6-dimethylphenol and 2,3,6-trimethylphenol. The monofunctional phenol compound is not limited to these examples. The catalyst is, for example, a combination of a copper salt and an amine. Examples of the copper salt include CuCl, CuBr, CuI, $CuCl_2$ and $CuBr_2$. Examples of the amine include n-butylamine, n-butyldimethylamine, N,N'-dit-butylethylenediamine, pyridine, N,N, N',N'-tetramethylethylenediamine, piperidine and imidazole. The catalyst is not limited to these examples. Examples of the solvent include toluene, methanol, methyl ethyl ketone and xylene. The solvent is not limited to these examples.

As for a method of the vinylbenzyl etherification of a terminal phenolic hydroxyl group of the bifunctional phenylene ether oligomer, for example, it can be carried out by dissolving the bifunctional phenylene ether oligomer and vinylbenzyl chloride in a solvent, adding a base to the thus-obtained solution under heat with stirring to allow the components to react and then solidifying a resin. Examples of the vinylbenzyl chloride include o-vinylbenzylchloride, m-vinylbenzylchloride, p-vinylbenzylchloride and mixtures of these. The vinylbenzyl chloride is not limited to these examples.

Examples of the base include sodium hydroxide, potassium hydroxide, sodium methoxide and sodium ethoxide. The base is not limited to these examples. An acid can be used in order to neutralize the base which remains after the reaction.

Examples of the acid include hydrochloric acid, sulfuric acid, phosphoric acid, boric acid and nitric acid. The acid is not limited to these examples. Examples of the solvent for the reaction include toluene, xylene, acetone, methyl ethyl ketone, methyl isobutyl ketone, dimethylformamide, dimethylacetamide, methylene chloride and chloroform. The solvent for the reaction is not limited to these examples. As a method of the solidification of the resin, a method in which the solvent is evaporated to dry and solidify the resin and a method in which a reaction liquid is mixed with a poor solvent to precipitate the resin can be adopted. The method of the solidification is not limited to these methods.

The amount of the vinyl compound (a) is preferably 30 to 95 parts by weight, particularly preferably 50 to 80 parts by weight, in 100 parts by weight of a resin solid content in the resin composition. When the amount of the vinyl compound (a) is not in the above range, a problem about electrical characteristics or reactivity occurs.

The maleimide compound (b) containing at least two maleimide groups in a molecule, represented by the formula (5), used in the present invention is not specially limited so long as it is a maleimide compound of the formula (5) in which Z is an organic group having 200 or less carbon atoms which may contain an oxygen atom, a sulfur atom, a phosphorus atom and/or a nitrogen atom, and c is an integer of 2 to 20. When the number of maleimide groups in a molecule is increased, an unreacted maleimide group is apt to remain at the time of curing. When maleimide equivalent becomes large, reactivity becomes poor. For these reasons, preferably, c is 2 to 10 and the maleimide equivalent is 2,000 or less (g/maleimide group). More preferably, c is 2 to 10 and the maleimide equivalent is 1,000 or less (g/maleimide group). Most preferably, c is 2 to 10 and the maleimide equivalent is 500 or less (g/maleimide group). Z is preferably a hydrocarbon group, an organic group comprising a carbon atom, a hydrogen atom and an oxygen atom, an organic group comprising a carbon atom, a hydrogen atom and a nitrogen atom or an organic group comprising a carbon atom, a hydrogen atom, a nitrogen atom and an oxygen atom.

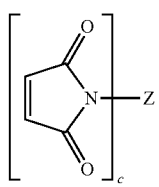

(5)

Examples of the maleimide compound (b) include 1,1'-(methylenedi-4,1-phenylene)bismaleimide, N,N'-m-phenylenebismaleimide, 2,2'-bis-[4-(4-maleimidophenoxy)phenyl]propane, 3,3'-dimethyl-5,5'-diethyl-4,4'-diphenylmethane bismaleimide, 4-methyl-1,3-phenylenebismaleimide, 4,4'-diphenyletherbismaleimide, 4,4'-diphenylsulfone bismaleimide, 1,3-bis(3-maleimidophenoxy)benzene, 1,3-bis(4-maleimidophenoxy)benzene, N,N'-4,4'-diphenylether bismaleimide, N,N'-4,4-dicyclohexylmethane bismaleimide, N,N'-ethylene bismaleimide, N,N'-butylene bismaleimide, N,N'-hexamethylene bismaleimide, N,N'-diphenylcyclohexane bismaleimide, 1,6-bismaleimido-(2,2,4-trimethyl)hexane, 1,6-bismaleimidohexane, 1,11-bismaleimidodiethylene glycol, 1,4-bis(4-maleimidophenoxy)ethane, 1,4-bis(4-maleimidophenoxy)propane, 1,4-bis(4-maleimidophenoxy)butane, 1,4-bis(4-maleimidophenoxy)hexane, tris(4-maleimidophenyl)amine, bis(4-maleimidophenyl)methylamine, bis(4-maleimidophenyl)phenylamine, N,N'-4,4'-diphenylsulfone bismaleimide, N,N'-4,4'-diphenylsulfide bismaleimide, a polycondensate of aniline, formaldehyde and maleic anhydride, poly(oxy-1,4-butanediyl), and α-[4-(2,5-dihydro-2,5-dioxo-1H-pyrrole-1-yl)benzoyl]oxy-ω-[[4-(2,5-dihydro-2,5-dioxo-1H-pyrrole-1-yl)benzoyl]oxy]-. The maleimide compound (b) is not limited to these examples. The maleimide compound (b) can be used singly or at least two maleimide compounds (b) can be used in combination. Bismaleimide is preferred in terms of the reactivity with the vinyl compound and heat resistance after moisture absorption.

The amount of the maleimide compound (b) used in the present invention is preferably in the range of from 0.01 to 20 parts by weight, particularly preferably 1 to 15 parts by weight, in 100 parts by weight of a resin solid content in the resin composition. When the amount of the maleimide compound (b) is not in the above range, the reactivity is high and electrical characteristics and heat resistance after moisture absorption are decreased in some cases.

The cyanate ester resin (c) used in the present invention is not specially limited so long as it is selected from cyanate ester resins represented by the formula (6) and prepolymers thereof. The cyanate ester resin (c) represented by the formula (6) is obtained by condensation of a cyanic acid and a naphthol aralkyl resin which is obtained by reaction between a naphthol such as α-naphthol or β-naphthol and p-xylyleneglycol, α,α'-dimethoxy-p-xylene, 1,4-di(2-hydroxy-2-propyl)benzene or the like. The process for producing the cyanate ester resin (c) is not specially limited. The cyanate ester resin (c) can be produced by any method known as a cyanate ester synthesis method.

Specifically, for example, the cyanate ester resin (c) is obtained by reacting a naphthol aralkyl resin represented by the formula (13) and a cyanogen halide in an inactive organic solvent in the presence of a basic compound. Further, it is possible to adopt a synthesis method in which a salt of a similar naphthol aralkyl resin and a basic compound is formed in a solution containing water and then the salt is reacted with a cyanogen halide in a two-phase interface reaction, thereby synthesizing the cyanate ester resin (c). The amount of the cyanate ester resin (c) used in the present invention is preferably in the range of from 1 to 25 parts by weight, particularly preferably 3 to 15 parts by weight, in 100 parts by weight of a resin solid content in the resin composition. When the amount of the cyanate ester resin (c) is not in the above range, electrical characteristics and heat resistance after moisture absorption are decreased in some cases.

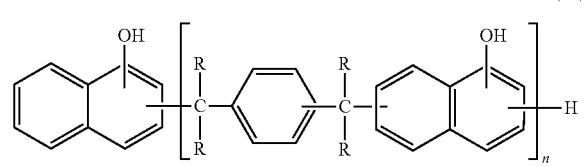

(13)

wherein R represents a hydrogen atom or a methyl group and n is from 1 to 10.

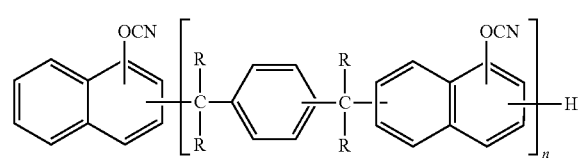

(6)

wherein R represents a hydrogen atom or a methyl group and n is from 1 to 10.

The naphthalene-skeleton-modified novolak type epoxy resin (d) used in the present invention is an epoxy resin having a repeating structure of the formula (7) and having a naphthalene skeleton in a molecule,

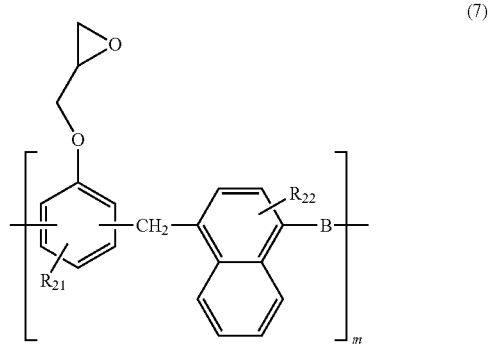

(7)

wherein $R_{21}$ represents an alkyl group having 1 to 6 carbon atoms, $R_{22}$ represents an alkyl group having 1 to 6 carbon atoms or an alkoxy group having 1 to 6 carbon atoms, B is a direct bond (that is, a naphthalene ring directly bonds to a benzene ring of an adjacent repeating unit) or an alkylene group having 1 to 6 carbon atoms, and m is from 1 to 10.

The naphthalene-skeleton-modified novolak type epoxy resin (d) is characterized in that it is excellent in heat resistance, flame retardancy, moisture resistance and dielectric characteristics as compared with general-purpose epoxy resins, since a naphthalene skeleton is given in a high density into a molecule. In particular, it is preferred that the above epoxy resin (d) has a repeating structure represented by the formula (14). Specifically, HP5000 and EXA9900, supplied by DIC Corporation, can be used as the epoxy resin (d). The total amount of the aforementioned cyanate ester resin (c) and the naphthalene-skeleton-modified novolak type epoxy resin (d) is preferably 3 to 30 parts by weight, particularly preferably 5 to 25 parts by weight, in 100 parts by weight of a resin solid content in the resin composition. When it is not in the above range, peel strength, electrical characteristics or heat resistance after moisture absorption are decreased in some cases.

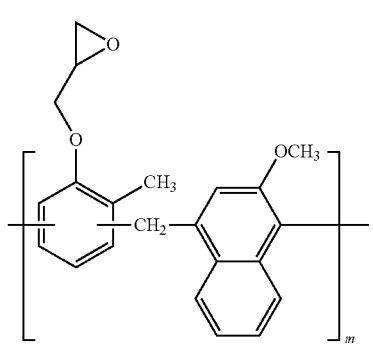

(14)

wherein m is from 1 to 10.

A cyclophosphazene compound having a cyano group or a brominated polycarbonate resin is preferably used as a flame retardant in the present invention. These flame retardants are characterized in that these flame retardants are excellent in heat resistance, electrical characteristics and solvent solubility. The amount of the cyclophosphazene compound having a cyano group is preferably 10 to 30 parts by weight, particularly preferably 15 to 25 parts by weight, per 100 parts by weight of a resin solid content in the resin composition. When it is not in the above range, a problem is that flame retardancy or peel strength is decreased. The molecular weight of the brominated polycarbonate resin is not specially limited. It is preferably 500 to 2,000 as a weight average molecular weight. The content of bromine in the brominated polycarbonate resin is preferably 30 to 80%. The amount of the brominated polycarbonate resin is preferably 5 to 25 parts by weight, particularly preferably 10 to 20 parts by weight, per 100 parts by weight of a resin solid content in the resin composition. When it is not in the above range, a problem is that flame retardancy or peel strength is decreased.

The inorganic filler used in the present invention is not specially limited so long as it is selected from general inorganic fillers for laminates. Specifically, examples of the inorganic filler include silicas such as natural silica, fused silica, synthetic silica, amorphous silica and hollow silica, molybdenum compounds such as molybdenum oxide and zinc molybdate, zinc borate, zinc stannate, alumina, clay, kaolin, talc, calcined clay, calcined kaolin, calcined talc, mica, short glass fiber (fine powders of glasses such as E glass or D glass) and hollow glass. The inorganic filler can be used singly or at least two inorganic fillers can be used in combination.

The average particle diameter (D50) of the inorganic filler to be used is not specially limited, while a mesoporous silica, a spherical fused silica, a spherical synthetic silica and a hollow spherical silica, each of which has an average particle diameter (D50) of 0.1 to 3 μm, are preferred in consideration of dispersibility. When the average particle diameter is not in the range of from 0.1 to 3 μm, a problem about flowing characteristic at the time of molding or a problem of breakage of a small-diameter drill bit in use occurs in some cases. The amount of the inorganic filler is not specially limited. It is preferably 10 to 150 parts by weight, particularly preferably 20 to 100 parts by weight, per 100 parts by weight of a resin solid content in the resin composition. When the amount of the inorganic filler is too large, moldability is decreased in some cases. For this reason, the amount of the inorganic filler is particularly preferably 100 parts by weight or less.

A silane coupling agent or a wetting and dispersing agent can be used jointly with the inorganic filler. The silane coupling agent is not specially limited so long as it is selected from silane coupling agents which are generally used for surface-treating inorganic substances. Specific examples of the silane coupling agent include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The silane coupling agent can be used singly or at least two silane coupling agents can be used in combination, as required.

A curing accelerator can be jointly used in the resin composition of the present invention, as required, for properly adjusting a curing speed. The curing accelerator is not specially limited so long as it is selected from curing accelerators which are generally used as a curing accelerator for the vinyl compound (a), the maleimide compound (b), the naphthol aralkyl type cyanate ester resin (c) and the naphthalene-skeleton-modified novolak type epoxy resin (d). Specific examples thereof include organic metal salts such as copper, zinc, cobalt and nickel, imidazoles and derivatives thereof, tertiary amines, and radical polymerization initiators.

A cross-linking type curing agent can be added to the resin composition of the present invention as required. The cross-linking type curing agent has an effect of increasing the fluidity of the resin composition and improving copper foil peel strength. In particular, a cross-linking curing agent having good compatibility with a terminal vinyl compound of a bifunctional phenylene ether oligomer having a polyphenylene ether skeleton is preferably used. Specific examples of the cross-linking type curing agent include a polyfunctional vinyl compound such as divinylbenzene, divinylnaphthalene or divinylbiphenyl, a vinylbenzyl ether compound synthesized by a reaction between phenol and vinylbenzyl chloride, and an allyl ether compound synthesized by a reaction between a styrene monomer, phenol and allyl chloride. Further, trialkenyl isocyanurate, etc., is preferable. In particular, trialkenyl isocyanurate having good compatibility is preferable. Especially, specifically, triallyl isocyanurate (TAIC) or triallyl cyanurate (TAC) is preferred. This is because these are excellent in moldability and a laminate excellent in copper foil peel strength can be obtained.

A polymerization inhibitor can be added to the resin composition of the present invention for increasing shelf life. The polymerization inhibitor can be selected from generally-known polymerization inhibitors. Examples thereof include quinones such as hydroquinone, methyl hydroquinone, p-benzoquinone, chloranil and trimethylquinone, aromatic diols, and di-t-butylhydroxytoluene.

A variety of high molecular weight compounds such as a different thermosetting resin, a thermoplastic resin and an oligomer thereof, and elastomers, a different flame retardant compound, an additive and the like can be further used in the resin composition of the present invention so long as the inherent properties of the resin composition are not impaired.

These are not specially limited so long as these are selected from those which are generally used. For instance, examples of the flame retardant compound include a bromine compound such as 4,4-dibromobiphenyl, phosphoric acid ester, melamine phosphate, a phosphorus-containing epoxy resin, a nitrogen compound such as melamine or benzoguanamine, an oxazine-ring-containing compound and a silicone compound. Examples of the additive include an ultraviolet absorber, an antioxidant, a photopolymerization initiator, a fluorescent brightening agent, a photosensitizer, a dye, a pigment, a thickener, a lubricant, an antifoamer, a dispersing agent, a leveling agent and a brightener. These can be used in combination as required.

The varnish provided by the present invention comprises the aforementioned resin composition and an organic solvent. The organic solvent is not specially limited so long as it dissolves a mixture of the vinyl compound (a), the maleimide compound (b), the cyanate ester resin (c) and the epoxy resin (d). Specific examples thereof include ketones such as acetone, methyl ethyl ketone and methyl isobutyl ketone; polar solvents such as dimethylacetamide and dimethylformamide; and aromatic hydrocarbon solvents such as toluene and xylene. The organic solvent can be used singly or at least two organic solvents can be used in combination. A procedure of dissolving the components for the preparation of the varnish is not specially limited. It is possible to dissolve the components in the above organic solvent and then mix them. Otherwise, it is also possible to mix all the components and then dissolve the resultant mixture in the organic solvent. The concentration of a resin solid content in the varnish is preferably 55 to 70%, particularly preferably 60 to 65%. When it is not in the above range, the shelf life of the varnish or the impregnating ability of the varnish in a glass woven fabric worsens in some cases.

The glass woven fabric used in the present invention is typically E glass, D glass, S glass, T glass, NE glass or quartz. The thickness of the glass woven fabric is not specially limited. A glass woven fabric for a laminate, which has a thickness of 0.01 to 0.2 mm and, in particular, which is subjected to super opening treatment or clogging treatment, is preferred in terms of dimensional stability. Further, a glass woven fabric subjected to surface-treatment with a silane-coupling agent, such as epoxysilane treatment or aminosilane treatment, is preferably used in terms of heat resistance after moisture absorption.

A process of producing the prepreg of the present invention is not specially limited so long as it is a method in which the prepreg is produced by combining the aforementioned resin composition and the glass woven fabric. Specifically, the resin composition of the present invention is impregnated into the glass woven fabric and the resultant glass woven fabric is dried, for example, at 130° C. to 180° C. for about 3 to 20 minutes, thereby obtaining a prepreg which is in a semi-cured and B-staged state and has a resin amount of about 30 to 90% by weight. In the above resin amount, the amount of the inorganic filler is included. The impregnation can be carried out by a known method. There are a method in which the varnish of the present invention is impregnated into the glass woven fabric and, in addition, a method in which the resin composition of the present invention is thermally molten and the molten resin composition is impregnated into the glass woven fabric.

The metal-foil-clad laminate provided by the present invention is obtained by laminate-molding in which the above prepreg is used. Specifically, a predetermined number of the above prepregs are stacked, copper foil (s) are provided on one surface or both surfaces of the stacked prepregs, and the copper foil(s) and the stacked prepregs are laminate-molded, for example, at a temperature of 180 to 220° C. for a heating time of 100 to 300 minutes under a surface pressure of 20 to 40 kg/cm$^2$, thereby obtaining a copper-clad laminate. The thickness of the copper foil to be used is not specially limited. An electrolytic copper foil having a thickness of 3 to 35 μm is preferably used. The electrolytic copper foil is not specially limited so long as it is selected from general electrolytic copper foils for laminates. An electrolytic copper foil having small mat surface roughness is preferred in consideration of a conductor loss in a high frequency region. As a method of producing a multilayer board, for instance, copper foils having a thickness of 35 μm each are provided on both surfaces, one copper foil on each surface, of one prepreg of the present invention, the copper foils and the prepreg are laminate-molded under the above conditions, then an inner layer circuit is formed, and the circuit is subjected to blacking treatment, to form an inner layer circuit board. Such inner layer circuit boards and the prepregs of the present invention are one by one disposed alternatively, copper foils are disposed as outermost layers, and the circuit boards, the prepregs and the copper foils are laminate-molded under the above conditions, preferably in vacuum, thereby obtaining a multilayer board.

The resin sheet provided by the present invention is obtained by applying the aforementioned varnish to a base material, drying the applied varnish and then separating or etching the base material. Examples of the base material include organic film base materials such as polyethylene film, polypropylene film, polycarbonate film, polyethylene terephthalate film, ethylene tetrafluoroethylene copolymer film, a releasing film obtained by applying a releasing agent to the surface of any one of these films, and polyimide film, conductive foils such as copper foil and aluminum foil, and plate-like base materials such as glass plate, SUS plate and FRP. As an application method, for example, there is a method in which a solution of the resin composition is applied to the base material with a bar coater, a die coater, a doctor blade, a baker applicator or the like and the solvent is removed by drying.

Drying conditions for removing the solvent by drying are not specially limited. When the drying is carried out at a low temperature, the solvent is apt to remain in the resin composition. When the drying is carried out at a high temperature, curing of the resin composition advances. Therefore, it is preferred that the drying is carried out at a temperature of 20° C. to 150° C. for 1 to 90 minutes. The thickness of a resin layer can be adjusted by the concentration of the resin composition solution and the application thickness of the resin composition solution. When the application thickness is large, the solvent is apt to remain at the time of drying. Therefore, the application thickness of the resin composition solution is preferably 0.1 to 500 μm.

The resin composition of the present invention can be used as an insulating layer of a printed wiring board or a material for a semiconductor package. For example, a resin-attached copper foil can be prepared by applying a solution of the curable resin composition of the present invention in a solvent to a copper foil as a base material and drying the applied solution. Further, a film for buildup, a dry film solder resist or a die attach film can be prepared by applying a solution of the curable resin composition of the present invention in a solvent to a separable plastic film as a base material and drying the applied solution. The solvent can be dried and removed by heating at a temperature of 20° C. to 150° C. for 1 to 90 minutes. The curable resin composition can be used in an uncured state only after removing solvent by drying, and it can be also used in a semi-cured state, as required.

EXAMPLES

The present invention will be concretely explained with reference to Examples and Comparative Examples, hereinafter, while the present invention shall not be limited to these Examples.

Synthetic Example 1

Synthesis of Bifunctional Phenylene Ether Oligomer 9.36 g (42.1 mmol) of $CuBr_2$, 1.81 g (10.5 mmol) of N,N'-di-t-butylethylenediamine, 67.77 g (671.0 mmol) of n-butyldimethylamine and 2,600 g of toluene were charged into a longitudinally long reactor having a volume of 12 liters and equipped with a stirrer, a thermometer, an air-introducing tube and baffleplates. The mixture was stirred at a reaction temperature of 40° C. A mixed solution was obtained by dissolving 129.32 g (0.48 mol) of 2,2',3,3',5,5'-hexamethyl-(1,1'-biphenol)-4,4'-diol, 878.4 g (7.2 mol) of 2,6-dimethylphenol, 1.22 g (7.2 mmol) of N,N'-di-t-butylethylenediamine and 26.35 g (260.9 mmol) of n-butyldimethylamine in 2,300 g of methanol in advance. The mixed solution was dropwise added to the mixture in the reactor over 230 minutes with stirring while bubbling was carried out with a nitrogen-air mixed gas having an oxygen concentration of 8% at a flow rate of 5.2 L/min. After the completion of the addition, 1,500 g of water containing 48.06 g (126.4 mmol) of tetrasodium ethylenediamine tetraacetate dissolved therein was added to the stirred mixture to terminate the reaction. An aqueous layer and an organic layer were separated. Then, the organic layer was washed with 1N hydrochloric acid aqueous solution and then washed with pure water. The thus-obtained solution was concentrated to 50 wt % with an evaporator, to obtain 1,981 g of a toluene solution of a bifunctional phenylene ether oligomer compound (resin "A"). The resin "A" had a number average molecular weight of 1,975, a weight average molecular weight of 3,514 and a hydroxyl group equivalent of 990.

(Synthesis of Vinyl Compound)

833.40 g of the toluene solution of the resin "A", 76.7 g of vinylbenzyl chloride (trade name CMS-P; supplied by Seimi Chemical Co., Ltd.), 1,600 g of methylene chloride, 6.2 g of benzyldimethylamine, 199.5 g of pure water and 83.6 g of 30.5 wt % NaOH aqueous solution were charged into a reactor equipped with a stirrer, a thermometer and a reflux tube. The mixture was stirred at a reaction temperature of 40° C. The stirring was carried out for 24 hours. Then, an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 450.1 g of a vinyl compound "B". The vinyl compound "B" had a number average molecular weight of 2,250, a weight average molecular weight of 3,920 and a vinyl group equivalent of 1,189 g/vinyl group.

Synthetic Example 2

Synthesis of Bifunctional Phenylene Ether Oligomer 3.88 g (17.4 mmol) of $CuBr_2$, 0.75 g (4.4 mmol) of N,N'-di-t-butylethylenediamine, 28.04 g (277.6 mmol) of n-butyldimethylamine and 2,600 g of toluene were charged into a longitudinally long reactor having a volume of 12 liters and equipped with a stirrer, a thermometer, an air-introducing tube and baffleplates. The mixture was stirred at a reaction temperature of 40° C. A mixed solution was obtained by dissolving 129.3 g (0.48 mol) of 2,2',3,3',5,5'-hexamethyl-(1,1'-biphenol)-4,4'-diol, 233.7 g (1.92 mol) of 2,6-dimethylphenol, 64.9 g (0.48 mol) of 2,3,6-trimethylphenol, 0.51 g (2.9 mmol) of N,N'-di-t-butylethylenediamine and 10.90 g (108.0 mmol) of n-butyldimethylamine in 2,300 g of methanol in advance. The mixed solution was dropwise added to the mixture in the reactor over 230 minutes with stirring while bubbling was carried out with a nitrogen-air mixed gas having an oxygen concentration of 8% at a flow rate of 5.2 L/min. After the completion of the addition, 1,500 g of water containing 19.89 g (52.3 mmol) of tetrasodium ethylenediamine tetraacetate dissolved therein was added to the stirred mixture to terminate the reaction. An aqueous layer and an organic layer were separated. The organic layer was washed with 1N hydrochloric acid aqueous solution and then washed with pure water. The thus-obtained solution was concentrated to 50 wt % with an evaporator, to obtain 836.5 g of a toluene solution of a bifunctional phenylene ether oligomer compound (resin "C"). The resin "C" had a number average molecular weight of 986, a weight average molecular weight of 1,530 and a hydroxyl group equivalent of 471.

(Synthesis of Vinyl Compound)

836.5 g of the toluene solution of the resin "C", 162.6 g of vinylbenzyl chloride (trade name CMS-P; supplied by Seimi Chemical Co., Ltd.), 1,600 g of methylene chloride, 12.95 g of benzyldimethylamine, 420 g of pure water and 178.0 g of 30.5 wt % NaOH aqueous solution were charged into a reactor equipped with a stirrer, a thermometer and a reflux tube. The mixture was stirred at a reaction temperature of 40° C. The stirring was carried out for 24 hours. Then, an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 503.5 g of a vinyl compound "D". The vinyl compound "D" had a number average molecular weight of 1,187, a weight average molecular weight of 1,675 and a vinyl group equivalent of 590 g/vinyl group.

Synthetic Example 3

Synthesis of α-Naphthol Aralkyl Type Cyanate Ester Resin

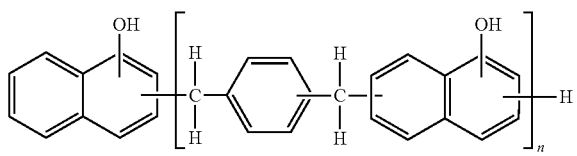

(15)

103 g (OH group 0.47 mol) of an α-naphthol aralkyl resin represented by the formula (15) (SN485, OH group equivalent: 219 g/eq., softening point: 86° C., supplied by Nippon Steel Chemical Co., Ltd.) was dissolved in 500 ml of chloroform. Then, 0.7 mol of triethylamine was added and mixed with the resultant solution. The solution was dropwise added to 300 g of a chloroform solution of 0.93 mol of cyanogen chloride at −10° C. over 1.5 hours. The resultant mixture was stirred for 30 minutes. Then, a mixed solution of 0.1 mol of triethylamine and 30 g of chloroform was dropwise added to the stirred mixture and the mixture was stirred for 30 minutes to complete the reaction. A hydrochloride of triethylamine to be generated was separated by filtering, to obtain a filtrate. The filtrate was washed with 500 ml of 0.1N hydrochloric acid and then washing with 500 ml of water was repeated four times. Then, a chloroform layer of chloroform/water mixed solution was extracted by liquid-separation treatment. Sodium sulfate was added to the chloroform solution to carry out dehydration treatment. The sodium sulfate was separated by filtering. Then, the resultant solution was evaporated at 75° C. and then further deaerated under reduced pressure at 90° C., to obtain a blackish brown solid α-naphthol aralkyl type cyanate ester resin represented by the formula (16). An absorption of a cyanate ester group was confirmed around 2264 cm$^{-1}$ in an infrared absorption spectrum. Further, a structure was identified by 13C-NMR and 1H-NMR. The conversion rate of from OH groups to OCN groups was 99% or higher.

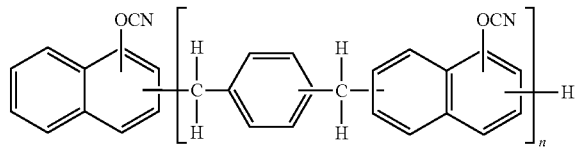

(16)

Synthetic Example 4

Synthesis of α-Naphthol Aralkyl Type Cyanate Ester Resin

An α-naphthol aralkyl type cyanate ester resin was synthesized in the same manner as in Synthetic Example 3 except that 103 g (OH group 0.47 mol) of the α-naphthol aralkyl resin (SN485, OH group equivalent: 219 g/eq., softening point: 86° C., supplied by Nippon Steel Chemical Co., Ltd.) was replaced with 102 g (OH group 0.45 mol) of an α-naphthol aralkyl resin (SN4105, OH group equivalent: 226 g/eq., softening point: 105° C., supplied by Nippon Steel Chemical Co., Ltd.) and that the amount of the cyanogen chloride was changed from 0.93 mol to 0.90 mol. The conversion rate of from OH groups to OCN groups was 99% or higher.

Example 1

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a naphthalene-skeleton-modified novolak type epoxy resin (HP-5000, supplied by DIC Corporation) and 0.05 part by weight of zinc octylate were mixed. The mixture was diluted with methyl ethyl ketone, to obtain a varnish having a resin solid content concentration of 65%. Table 1 shows the evaluation results of the shelf life at low temperature of the varnish.

Example 2

80 parts by weight of the vinyl compound "D" (number average molecular weight 1,187, vinyl group equivalent 590 g/vinyl group) obtained in Synthetic Example 2, 12 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 3 parts by weight of a naphthalene-skeleton-modified novolak type epoxy resin (HP-5000, supplied by DIC Corporation) and 0.05 part by weight of zinc octylate were mixed. The mixture was diluted with methyl ethyl ketone, to obtain a varnish having a resin solid content concentration of 65%. Table 1 shows the evaluation results of the shelf life at low temperature of the varnish.

Example 3

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 15 parts by weight of a naphthalene-skeleton-modified novolak type epoxy resin (HP-5000, supplied by DIC Corporation) and 0.05 part by weight of zinc octylate were mixed. The mixture was diluted with methyl ethyl ketone, to obtain a varnish having a resin solid content concentration of 65%. Table 1 shows the evaluation results of the shelf life at low temperature of the varnish.

Example 4

60 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a naphthalene-skeleton-modified novolak type epoxy resin (EXA-9900, supplied by DIC Corporation), 5 parts by weight of triallyl isocyanurate (TAIC), 5 parts by weight of triallyl cyanurate (TAC) and 0.05 part by weight of zinc octylate were mixed. The mixture was diluted with methyl ethyl ketone, to obtain a varnish having a resin solid content concentration of 65%. Table 1 shows the evaluation results of the shelf life at low temperature of the varnish.

Comparative Example 1

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a biphenyl aralkyl type novolak epoxy resin (NC3000H, supplied by Nippon Kayaku Co., Ltd.) and 0.05 part by weight of zinc octylate were mixed. The mixture was diluted with methyl ethyl ketone, to obtain a varnish having a resin solid content concentration of 65%. Table 2 shows the evaluation results of the shelf life at low temperature of the varnish.

Comparative Example 2

80 parts by weight of the vinyl compound "D" (number average molecular weight 1,187, vinyl group equivalent 590 g/vinyl group) obtained in Synthetic Example 2, 12 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 3 parts by weight of a biphenyl aralkyl type novolak epoxy resin (NC3000H, supplied by Nippon Kayaku Co., Ltd.) and 0.05 part by weight of zinc octylate were mixed. The mixture was diluted with methyl ethyl ketone, to obtain a varnish having a resin solid content concentration of 65%. Table 2 shows the evaluation results of the shelf life at low temperature of the varnish.

Comparative Example 3

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 15 parts by weight of a biphenyl aralkyl type novolak epoxy resin (NC3000H, supplied by Nippon Kayaku Co., Ltd.) and 0.05 part by weight of zinc octylate were mixed. The mixture was diluted with methyl ethyl ketone, to obtain a varnish having a resin solid content concentration of 65%. Table 2 shows the evaluation results of the shelf life at low temperature of the varnish.

Comparative Example 4

60 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a biphenyl aralkyl type novolak epoxy resin (NC3000H, supplied by Nippon Kayaku Co., Ltd.), 5 parts by weight of triallyl isocyanurate (TAIC), 5 parts by weight of triallyl cyanurate (TAC) and 0.05 part by weight of zinc octylate were mixed. The mixture was diluted with methyl ethyl ketone, to obtain a varnish having a resin solid content concentration of 65%. Table 2 shows the evaluation results of the shelf life at low temperature of the varnish.

Example 5

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a naphthalene-skeleton-modified novolak type epoxy resin (HP-5000, supplied by DIC Corporation), 0.05 part by weight of zinc octylate and 0.1 part by weight of di-t-butylhydroxytoluene (supplied by Kawaguchi Chemical Industry Co., LTD.) were mixed. The mixture was diluted with methyl ethyl ketone, to obtain a varnish having a resin solid content concentration of 65%. Table 3 shows the evaluation results of the shelf life at normal temperature of the varnish.

Example 6

70 parts by weight of the vinyl compound "B" (number average molecular weight 2,250, vinyl group equivalent 1,189 g/vinyl group) obtained in Synthetic Example 1, 10 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 15 parts by weight of a naphthalene-skeleton-modified novolak type epoxy resin (HP-5000, supplied by DIC Corporation) and 0.05 part by weight of zinc octylate were mixed. The mixture was diluted with methyl ethyl ketone, to obtain a varnish having a resin solid content concentration of 65%. The varnish was stored in a cold insulation storehouse at 5° C. for 2 weeks. Then, the varnish was impregnated into an E glass cloth having a thickness of 0.08 mm (IPC No. -#3313) and the varnish-impregnated glass cloth was dried under heat at 160° C. for 8 minutes, whereby prepregs having a resin amount of 55% by weight were obtained. Eight prepregs having a resin amount 55%, obtained above, were stacked. 18 μm copper foils (3EC-HTE, supplied by Mitsui Mining & Smelting Co., LTD.) were disposed on both sides of the stacked prepregs, one copper foil on each side. The copper foils and the prepregs were vacuum-pressed under a pressure of 30 kg/cm$^2$ at a temperature of 210° C. for 150 minutes, to obtain an 18 μm-copper-clad laminate having a thickness of 0.8 mm. Table 4 shows the values of physical properties of the above copper-clad laminate.

Example 7

64 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 3 parts by weight of a naphthalene-skeleton-modified novolak type epoxy resin (HP-5000, supplied by DIC Corporation), 18 parts by weight of cyclophosphazene having a cyano group (FP-300, supplied by FUSHIMI Pharmaceutical Co., LTD.), 50 parts by weight of a spherical silica (SC2050, average particle diameter 0.5 μm, supplied by Admatechs Company Limited), 5 parts by weight of triallyl cyanurate (TAC) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 4 shows the values of physical properties of the copper-clad laminate.

Example 8

67 parts by weight of the vinyl compound "D" (number average molecular weight 1,187, vinyl group equivalent 590 g/vinyl group) obtained in Synthetic Example 2, 4 parts by weight of the naphthol aralkyl type cyanate ester resin (cyanate equivalent: 237 g/eq.) obtained in Synthetic Example 3, 3 parts by weight of bismaleimide (BMI-70, supplied by Nippon Kayaku Co., Ltd.), 10 parts by weight of a naphthalene-skeleton-modified novolak type epoxy resin (EXA-9900, supplied by DIC Corporation), 16 parts by weight of a brominated polycarbonate resin (FG8500, supplied by TEIJIN Chemicals LTD.), 50 parts by weight of a spherical synthetic silica (SC2050, average particle diameter 0.5 μm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 4 shows the values of physical properties of the copper-clad laminate.

Example 9

71 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 3 parts by weight of a naphthalene-skeleton-modified novolak type epoxy resin (EXA-9900, supplied by DIC Corporation), 16 parts by weight of a brominated polycarbonate resin (FG8500, supplied by TEIJIN Chemicals LTD.), 25 parts by weight of a spherical silica (SC2050, average particle diameter 0.5 μm, supplied by Admatechs Company Limited) and 0.06 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 4 shows the values of physical properties of the copper-clad laminate.

Example 10

71 parts by weight of the vinyl compound "B" (number average molecular weight 2,250, vinyl group equivalent 1,189 g/vinyl group) obtained in Synthetic Example 1, 5 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 3 parts by weight of a naphthalene-skeleton-modified novolak type epoxy resin (EXA-9900, supplied by DIC Corporation), 16 parts by weight of a brominated polycarbonate resin (FG8500, supplied by TEIJIN Chemicals LTD.), 30 parts by weight of a mesoporous silica (MSF-01P, average particle diameter 1.3 μm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 4 shows the values of physical properties of the copper-clad laminate.

Example 11

60 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 244 g/eq.) obtained in Synthetic Example 4, 3 parts by weight of bismaleimide (BMI-70, supplied by Nippon Kayaku Co., Ltd.), 9 parts by weight of a naphthalene-skeleton-modified novolak type epoxy resin (HP-5000, supplied by DIC Corporation), 18 parts by weight of a cyclophosphazene having a cyano group (FP-300, supplied by FUSHIMI Pharmaceutical Co., LTD.), 70 parts by weight of a spherical silica (SC2050, average particle diameter 0.5 μm, supplied by Admatechs Company Limited), 5 parts by weight of triallyl isocyanurate (TAIC) and 0.05 part by weight of zinc octylate were mixed. The mixture was diluted with methyl ethyl ketone, to obtain a varnish having a resin solid content concentration of 65%. Further, the varnish was weighed in a separable flask having a stirrer, and methyl ethyl ketone was added to the varnish such that a solid content concentration became 20% by weight. The resultant mixture was heated at 60° C. and stirred for 1 hour, to prepare a resin composition solution. The thus-obtained solution was stored in a cold insulation storehouse at 5° C. for 2 weeks. Then, the solution was applied to a mat surface of an 18 μm electrolytic copper foil (3EC-HTE: supplied by Mitsui Mining & Smelting Co., LTD.) with a doctor blade (gap 200 μm). The applied solution was air-dried at room temperature for 10 minutes and then dried with an air blowing dryer at 50° C. for 20 minutes, whereby copper-foil-attached resin sheets having a resin layer thickness of about 15 μm each were obtained. The copper-foil-attached resin sheets were disposed on the upper and lower sides of an etched core material having a thickness of 0.8 mm (CCL-EL190T, supplied by Mitsubishi Gas Chemical Co., Inc.), one resin sheet on each side, and the resin sheets and the core material were vacuum-pressed under a pressure of 30 kg/cm$^2$ at a temperature of 210° C. for 150 minutes, to obtain a resin-sheet-attached 18 μm-copper-clad laminate having a thickness of 0.85 mm. Table 4 shows the values of physical properties of the above copper-clad laminate.

Comparative Example 6

60 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 244 g/eq.) obtained in Synthetic Example 4, 3 parts by weight of bismaleimide (BMI-70, supplied by Nippon Kayaku Co., Ltd.), 9 parts by weight of a biphenyl aralkyl type novolak epoxy resin (NC3000H, supplied by Nippon Kayaku Co., Ltd.), 18 parts by weight of a cyclophosphazene having a cyano group (FP-300, supplied by FUSHIMI Pharmaceutical Co., LTD.), 70 parts by weight of a spherical silica (SC2050, average particle diameter 0.5 μm, supplied by Admatechs Company Limited), 5 parts by weight of triallyl isocyanurate (TAIC) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 5 shows the values of physical properties of the copper-clad laminate.

Comparative Example 7

64 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 3 parts by weight of a biphenyl aralkyl type novolak epoxy resin (NC3000H, supplied by Nippon Kayaku Co., Ltd.), 18 parts by weight of a cyclophosphazene having a cyano group (FP-300, supplied by FUSHIMI Pharmaceutical Co., LTD.), 50 parts by weight of a spherical silica (SC2050, average particle diameter 0.5 μm, supplied by Admatechs Company Limited), 5 parts by weight of triallyl cyanurate (TAC) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 5 shows the values of physical properties of the copper-clad laminate.

Comparative Example 8

67 parts by weight of the vinyl compound "D" (number average molecular weight 1,187, vinyl group equivalent 590 g/vinyl group) obtained in Synthetic Example 2, 4 parts by weight of the naphthol aralkyl type cyanate ester resin (cyanate equivalent: 237 g/eq.) obtained in Synthetic Example 3, 3 parts by weight of bismaleimide (BMI-70, supplied by Nippon Kayaku Co., Ltd.), 10 parts by weight of a biphenyl aralkyl type novolak epoxy resin (NC3000H, supplied by Nippon Kayaku Co., Ltd.), 16 parts by weight of a brominated polycarbonate resin (FG8500, supplied by TEIJIN Chemicals LTD.), 50 parts by weight of a spherical synthetic silica (SC2050, average particle diameter 0.5 µm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 5 shows the values of physical properties of the copper-clad laminate.

Comparative Example 9

71 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 237 g/eq.) obtained in Synthetic Example 3, 5 parts by weight of bismaleimide (BMI-70, supplied by Nippon Kayaku Co., Ltd.), 3 parts by weight of a biphenyl aralkyl type novolak epoxy resin (NC3000H, supplied by Nippon Kayaku Co., Ltd.), 16 parts by weight of a brominated polycarbonate resin (FG8500, supplied by TEIJIN Chemicals LTD.), 25 parts by weight of a spherical silica (SC2050, average particle diameter 0.5 µm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 5 shows the values of physical properties of the copper-clad laminate.

Comparative Example 10

71 parts by weight of the vinyl compound "B" (number average molecular weight 2,250, vinyl group equivalent 1,189 g/vinyl group) obtained in Synthetic Example 1, 5 parts by weight of the naphthol aralkyl type cyanate ester resin (cyanate equivalent: 244 g/eq.) obtained in Synthetic Example 4, 5 parts by weight of bismaleimide (BMI-70, supplied by Nippon Kayaku Co., Ltd.), 3 parts by weight of a biphenyl aralkyl type novolak epoxy resin (NC3000H, supplied by Nippon Kayaku Co., Ltd.), 16 parts by weight of a brominated polycarbonate resin (FG8500, supplied by TEIJIN Chemicals LTD.), 30 parts by weight of a mesoporous silica (MSF-01P, average particle diameter 1.3 µm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used in place of the varnish used in Example 6. Table 5 shows the values of physical properties of the copper-clad laminate.

Comparative Example 11

60 parts by weight of the vinyl compound "D" (number average molecular weight 1,187, vinyl group equivalent 590 g/vinyl group) obtained in Synthetic Example 2, 5 parts by weight of the naphthol aralkyl type cyanate ester resin (cyanate equivalent: 244 g/eq.) obtained in Synthetic Example 4, 3 parts by weight of bismaleimide (BMI-70, supplied by Nippon Kayaku Co., Ltd.), 9 parts by weight of a biphenyl aralkyl type novolak epoxy resin (NC3000H, supplied by Nippon Kayaku Co., Ltd.), 18 parts by weight of a cyclophosphazene having a cyano group (FP-300, supplied by FUSHIMI Pharmaceutical Co., LTD.), 65 parts by weight of a spherical silica (SC2050, average particle diameter 0.5 µm, supplied by Admatechs Company Limited), 5 parts by weight of triallyl isocyanurate (TAIC) and 0.06 part by weight of zinc octylate were mixed. The mixture was diluted with methyl ethyl ketone, to obtain a varnish having a resin solid content concentration of 65%. A resin-sheet-attached copper-clad laminate was obtained in the same manner as in Example 11 except that this varnish was used in place of the varnish used in Example 11. Table 5 shows the values of physical properties of the resin-sheet-attached copper-clad laminate.

Comparative Example 12

67 parts by weight of the vinyl compound "D" (number average molecular weight 1,187, vinyl group equivalent 590 g/vinyl group) obtained in Synthetic Example 2, 4 parts by weight of the naphthol aralkyl type cyanate ester resin (cyanate equivalent: 237 g/eq.) obtained in Synthetic Example 3, 3 parts by weight of bismaleimide (BMI-70, supplied by Nippon Kayaku Co., Ltd.), 10 parts by weight of a biphenyl aralkyl type novolak epoxy resin (NC3000H, supplied by Nippon Kayaku Co., Ltd.), 16 parts by weight of a brominated polycarbonate resin (FG8500, supplied by TEIJIN Chemicals LTD.), 50 parts by weight of a spherical synthetic silica (SC2050, average particle diameter 0.5 µm, supplied by Admatechs Company Limited) and 0.05 part by weight of zinc octylate were mixed. The mixture was diluted with methyl ethyl ketone, to obtain a varnish having a resin solid content concentration of 65%. A copper-clad laminate was obtained in the same manner as in Example 6 except that this varnish was used immediately after its preparation without 2-week storage at 5° C. Table 6 shows the values of physical properties of the copper-clad laminate.

TABLE 1

| Shelf life of varnish at low temperature | | Example 1 | Example 2 | Example 3 | Example 4 |
|---|---|---|---|---|---|
| Appearance of varnish | Immediately after preparation | Transparent | Transparent | Transparent | Transparent |
| | After 2 weeks | Transparent | Transparent | Transparent | Transparent |

TABLE 2

| Shelf life of varnish at low temperature | | CEx. 1 | CEx. 2 | CEx. 3 | CEx. 4 |
|---|---|---|---|---|---|
| Appearance of varnish | Immediately after preparation | Trans-parent | Trans-parent | Trans-parent | Trans-parent |
| | After 2 weeks | Cloudy | Lightly cloudy | Cloudy | Cloudy |

CEx. = Comparative Example

TABLE 3

| Shelf life of varnish at normal temperature | | Example 1 | Example 5 |
|---|---|---|---|
| Generation of high molecular weight compound | Immediately after preparation | No | No |
| | After 4 weeks | Yes | no |

TABLE 4

| Evaluation results of copper-clad laminate | Ex. 6 | Ex. 7 | Ex. 8 | Ex. 9 | Ex. 10 | Ex. 11 |
|---|---|---|---|---|---|---|
| Dielectric constant (10 GHz) | 3.8 | 3.6 | 3.6 | 3.4 | 3.4 | Not measured |
| Dielectric loss tangent (10 GHz) | 0.0060 | 0.0055 | 0.0060 | 0.0050 | 0.0050 | Not measured |
| Peel strength (Spec.: >0.7 kg/cm) | ○ | ○ | ○ | ○ | ○ | ○ |
| Heat resistance after moisture absorption PCT-4 hours 288° C./30 second immersion | ○○○○ | ○○○○ | ○○○○ | ○○○○ | ○○○○ | ○○○○ |

Ex. = Example

TABLE 5

| Evaluation results of copper-clad laminate | CEx. 6 | CEx. 7 | CEx. 8 | CEx. 9 | CEx. 10 | CEx. 11 |
|---|---|---|---|---|---|---|
| Dielectric constant (10 GHz) | 3.8 | 3.6 | 3.6 | 3.4 | 3.4 | Not measured |
| Dielectric loss tangent (10 GHz) | 0.0060 | 0.0055 | 0.0060 | 0.0050 | 0.0050 | Not measured |
| Peel strength (Spec.: 0.7 kg/cm) | x | x | x | x | x | x |
| Heat resistance after moisture absorption PCT-4 hours 288° C./30 second immersion | ○xxx | ○○xx | ○xxx | ○○xx | ○○xx | ○xxx |

CEx. = Comparative Example

TABLE 6

| Evaluation results of copper-clad laminate | Comparative Example 12 |
|---|---|
| Dielectric constant (10 GHz) | 3.6 |
| Dielectric loss tangent (10 GHz) | 0.0060 |
| Peel strength (Spec.: >0.7 kg/cm) | ○ |
| Heat resistance after moisture absorption PCT-4 hours 288° C./30 second immersion | ○○○○ |

(Measurement Methods)

1) A number average molecular weight and a weight average molecular weight were obtained by a gel permeation chromatography (GPC) method. Data processing was carried out based on the GPC curve and molecular weight calibration curve of a sample. The molecular weight calibration curve was obtained by making an approximation of a relation between the molecular weight of a standard polystyrene and an elution time with the following equation, $\text{Log } M = A_0 X^3 + A_1 X^2 + A_2 X + A_3 + A_4/X^2$, wherein M is a molecular weight, X is an elution time—19 (minute) and A is a coefficient.

2) A hydroxyl group equivalent was determined from an absorption intensity at 3,600 $cm^{-1}$ in an IR analysis (solution cell method; cell thickness=1 mm) in which 2,6-dimethylphenol was used as a standard reference material and dry dichloromethane was used as a solvent.

3) A vinyl group equivalent was determined from an absorption intensity at 910 $cm^{-1}$ in an IR analysis (solution cell method; cell thickness=1 mm) in which 1-octene was used as a standard reference material and carbon disulfide was used as a solvent.

4) A cyanate equivalent was determined as follows. The absorption of a cyanate ester group around 2264 $cm^{-1}$ in an infrared absorption spectrum was confirmed, then a structure was identified by 13C-NMR and 1H-NMR and a conversion rate of from OH groups into OCN groups was measured. The cyanate equivalent was calculated on the basis of the conversion rate from the OH equivalent of a naphthol aralkyl resin used for evaluation.

5) Shelf Life of Varnish at Low Temperature

A varnish was placed in a 300 cc glass sample bottle and the varnish was observed for transparency (turbidity) by visual observation. Then, the varnish was stored in a cold insulation storehouse at 5° C. for 2 weeks. Then, the varnish was again observed for transparency (turbidity) by visual observation. (n=1).

6) Shelf Life of Varnish at Normal Temperature

Measurements of a varnish were carried out on the basis of a GPC method immediately after its preparation and after leaving the varnish to stand for 4 weeks at room temperature (25° C.). "Yes" represents the appearance of a peak which showed the generation of a high molecular weight compound in a chart. "No" represents that a peak showing the generation of a high molecular weight compound did not appear.

7) Peel Strength

An 18 μm-copper-foil-attached specimen (30 mm×150 mm×0.8 mm) was measured for the peel strength of a copper foil two times in conformity with JIS C6481. An average value of at least 0.7 kg/cm in the two-time measurements was regarded as "Passing" (O) and an average value of less than 0.7 kg/cm was regarded as "Not passing" (x). (n=2).

8) Dielectric Constant and Dielectric Loss Tangent

A specimen of a copper-clad laminate having a thickness of 0.8 mm, from which a copper foil had been removed, was measured for a dielectric constant and a dielectric loss tangent at 10 GHz by a cavity resonator perturbation method (Agilent 8722ES, supplied by Agilent technologies). (n=1).

9) Heat Resistance after Moisture Absorption

A 5 cm×5 cm sample (n=4) obtained by etching a copper foil of an 18 μm-copper-foil-attached laminate having a thickness of about 0.8 mm was dried at 115° C. for 20 hours, then treated with a pressure cooker tester (supplied by Hirayama Manufacturing Corporation, PC-3 type) at 121° C. at 2 atmospheric pressure for 4 hours, and then immersed in a solder bath at 288° C. for 30 seconds. Four samples were observed for the presence or absence of swelling by visual observation, respectively. "o" represents no defect. "x" represents the occurrence of swelling.

What is claimed is:

1. A prepreg obtained by impregnating a resin composition into a glass woven fabric and semi-curing the resin-composition-impregnated glass woven fabric, wherein the resin composition contains a vinyl compound (a) represented by the formula (1), a maleimide compound (b) represented by the formula (5), a cyanate ester resin (c) represented by the formula (6) and an epoxy resin (d) having a repeating structure of the formula (7),

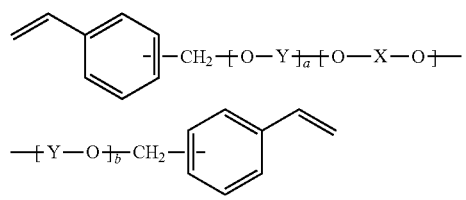

(1)

wherein —(O—X—O)— is a structure defined by the formula (2) or the formula (3), —(Y—O)— is an arrangement of a structure defined by the formula (4) or a random arrangement of at least two kinds of structures defined by the formula (4), and each of a and b is an integer of 0 to 100, provided that at least one of a and b is not 0,

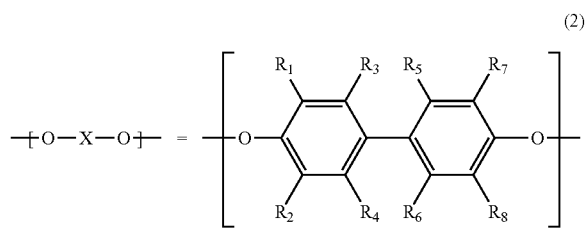

(2)

wherein $R_1$, $R_2$, $R_3$, $R_7$ and $R_8$ are the same or different and represent a halogen atom, an alkyl group having 6 or less carbon atoms or a phenyl group, $R_4$, $R_5$ and $R_6$ are the same or different and represent a hydrogen atom, a halogen atom, an alkyl group having 6 or less carbon atoms or a phenyl group,

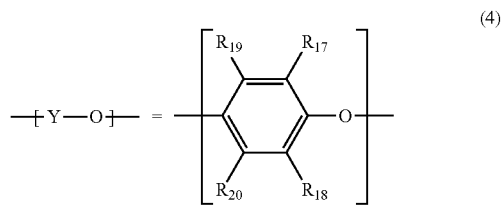

(4)

wherein $R_{17}$ and $R_{18}$ are the same or different and represent a halogen atom, an alkyl group having 6 or less carbon atoms or a phenyl group, and $R_{19}$ and $R_{20}$ are the same or different and represent a hydrogen atom, a halogen atom, an alkyl group having 6 or less carbon atoms or a phenyl group,

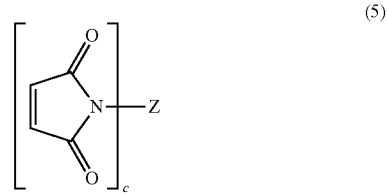

(5)

wherein Z represents an organic group having 200 or less carbon atoms which may contain at least one member selected from the group consisting of an oxygen atom, a sulfur atom, a phosphorus atom and a nitrogen atom, and c is an integer of 2 to 20,

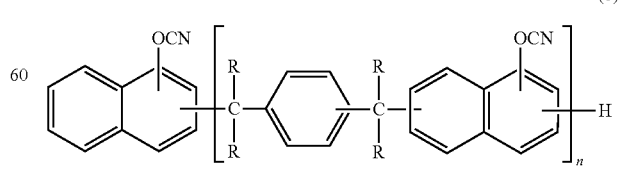

(6)

wherein R represents a hydrogen atom or a methyl group and n is from 1 to 10, (7)

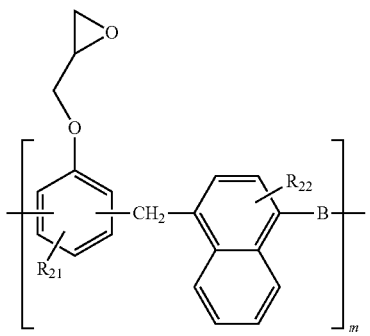

wherein $R_{21}$ represents an alkyl group having 1 to 6 carbon atoms, $R_{22}$ represents an alkyl group having 1 to 6 carbon atoms or an alkoxy group having 1 to 6 carbon atoms, B is a direct bond or an alkylene group having 1 to 6 carbon atoms, and m is from 1 to 10; and wherein an amount of vinyl compound (a) is in a range of from 50-80 parts by weight based on 100 parts by weight of a resin solid content of the resin composition.

2. The prepreg according to claim 1, wherein the resin composition which is thermally molten is impregnated into the glass woven fabric.

3. The prepreg according to claim 1, wherein a varnish comprising the resin composition and an organic solvent is impregnated into the glass woven fabric.

4. A metal-foil-clad laminate obtained by disposing metal foil(s) on one surface or both surfaces of a stack of at least one prepreg as defined in claim 1 and laminate-molding the resultant stack.

5. A resin sheet obtained by applying a varnish comprising the resin composition defined in claim 1 and an organic solvent to a surface of a metal foil or a film and drying the applied varnish.

* * * * *